(12) United States Patent
Sandhu et al.

(10) Patent No.: US 8,772,166 B2
(45) Date of Patent: *Jul. 8, 2014

(54) SPACER PROCESS FOR ON PITCH CONTACTS AND RELATED STRUCTURES

(75) Inventors: Gurtej Sandhu, Boise, ID (US); Mark Kiehlbauch, Boise, ID (US); Steve Kramer, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/526,792

(22) Filed: Jun. 19, 2012

(65) Prior Publication Data

US 2012/0258599 A1 Oct. 11, 2012

Related U.S. Application Data

(60) Continuation of application No. 12/781,681, filed on May 17, 2010, now Pat. No. 8,211,803, which is a division of application No. 11/933,664, filed on Nov. 1, 2007, now Pat. No. 7,737,039.

(51) Int. Cl.
*H01L 21/311* (2006.01)
(52) U.S. Cl.
USPC ........... 438/696; 438/942; 257/E21.038; 257/E21.231; 257/E33.066
(58) Field of Classification Search
USPC ........... 438/696, 942, E21.038, E21.231, 438/E33.066; 257/E21.038, E21.231, 257/E33.066
See application file for complete search history.

(56) References Cited

U.S. PATENT DOCUMENTS 4,234,362 A 11/1980 Riseman
4,419,809 A 12/1983 Riseman et al.
(Continued)

FOREIGN PATENT DOCUMENTS

DE 42 36 609 A1 5/1994
EP 0227303 7/1987
(Continued)

OTHER PUBLICATIONS

Cerofolini et al., "Strategies for nanoelectronics", *Microelectronic Engineering*, vol. 81, pp. 405-419.
(Continued)

*Primary Examiner* — Michelle Mandala
(74) *Attorney, Agent, or Firm* — Knobbe, Martens, Olson & Bear LLP

(57) ABSTRACT

Methods are disclosed, including for increasing the density of isolated features in an integrated circuit. Also disclosed are associated structures. In some embodiments, contacts are formed on pitch with other structures, such as conductive interconnects that may be formed by pitch multiplication. To form the contacts, in some embodiments, a pattern corresponding to some of the contacts is formed in a selectively definable material such as photoresist. Features in the selectively definable material are trimmed, and spacer material is blanket deposited over the features and the deposited material is then etched to leave spacers on sides of the features. The selectively definable material is removed, leaving a mask defined by the spacer material. The pattern defined by the spacer material may be transferred to a substrate, to form on pitch contacts. In some embodiments, the on pitch contacts may be used to electrically contact conductive interconnects in the substrate.

20 Claims, 19 Drawing Sheets

(56) References Cited

U.S. PATENT DOCUMENTS

| | | |
|---|---|---|
| 4,432,132 A | 2/1984 | Kinsbron et al. |
| 4,502,914 A | 3/1985 | Trumpp et al. |
| 4,508,579 A | 4/1985 | Goth et al. |
| 4,648,937 A | 3/1987 | Ogura et al. |
| 4,716,131 A | 12/1987 | Okazawa et al. |
| 4,776,922 A | 10/1988 | Bhattacharyya et al. |
| 4,803,181 A | 2/1989 | Buchmann et al. |
| 4,838,991 A | 6/1989 | Cote et al. |
| 5,013,680 A | 5/1991 | Lowrey et al. |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,858,620 A | 1/1999 | Ishibashi et al. |
| 5,895,740 A | 4/1999 | Chien et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,372,649 B1 | 4/2002 | Han et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,531,067 B1 | 3/2003 | Shiokawa et al. |
| 6,534,243 B1 | 3/2003 | Templeton et al. |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 | 3/2006 | Fisher et al. |
| 7,074,668 B1 | 7/2006 | Park et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,442,976 B2 | 10/2008 | Juengling |
| 7,537,866 B2 | 5/2009 | Liu |
| 7,851,135 B2 | 12/2010 | Jung |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura et al. |
| 2003/0006410 A1 | 1/2003 | Doyle |
| 2003/0044722 A1 | 3/2003 | Hsu et al. |
| 2003/0090002 A1 | 5/2003 | Sugawara et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0201710 A1 | 10/2003 | Rasmussen |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0087892 A1 | 4/2005 | Hsu et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0018345 A1 | 1/2007 | Chao |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |

(56) References Cited

U.S. PATENT DOCUMENTS

| | | |
|---|---|---|
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0172994 A1 | 7/2007 | Yang |
| 2007/0187358 A1 | 8/2007 | Van Haren et al. |
| 2007/0205438 A1 | 9/2007 | Juengling |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0224823 A1 | 9/2007 | Sandhu |
| 2007/0238308 A1 | 10/2007 | Niroomand et al. |
| 2007/0249170 A1 | 10/2007 | Kewley |
| 2007/0261016 A1 | 11/2007 | Sandhu et al. |
| 2007/0275309 A1 | 11/2007 | Liu |
| 2007/0281219 A1 | 12/2007 | Sandhu |
| 2008/0054350 A1 | 3/2008 | Breitwisch et al. |
| 2008/0057692 A1 | 3/2008 | Wells et al. |
| 2008/0070165 A1 | 3/2008 | Fischer et al. |
| 2008/0292991 A1 | 11/2008 | Wallow |
| 2008/0299774 A1 | 12/2008 | Sandhu |
| 2009/0035665 A1 | 2/2009 | Tran |

FOREIGN PATENT DOCUMENTS

| | | |
|---|---|---|
| EP | 0491408 | 6/1992 |
| EP | 1357433 | 10/2003 |
| JP | 57-048237 | 3/1982 |
| JP | 64-035916 | 2/1989 |
| JP | 05-343370 | 12/1993 |
| JP | H8-55908 | 2/1996 |
| JP | H8-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 10-1995-0034748 | 12/1995 |
| KR | 10-0122315 | 9/1997 |
| KR | 1999-0001440 | 1/1999 |
| KR | 1999-027887 | 4/1999 |
| TW | 376582 | 12/1999 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |
| WO | WO 2005/034215 A1 | 4/2005 |
| WO | WO 2006/026699 A2 | 3/2006 |

OTHER PUBLICATIONS

Search Report dated Sep. 11, 2013 in corresponding ROC (Taiwan) Patent Application 097142287.

Bergeron, et al., "Resolution Enhancement Techniques for the 90nm Technology Node and Beyond," Future Fab International, Issue 15, Jul. 11, 2003, 4 pages.

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Bruek, "Optical and interferometric lithography—Nanotechnology enablers," Proceedings of the IEEE, 2005, pp. 1704-1721, vol. 93, No. 10.

Choi et al., "Sublithographic nanofabrication technology for nanocatalysts and DNA chips," J. Vac. Sci. Technol., Nov./Dec. 2003, pp. 2951-2955.

Chung et al., "Pattern multiplication method and the uniformity of nanoscale multiple lines*," J.Vac.Sci.Technol. B21(4), Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Office Action dated Jun. 2, 2008 in U.S. Appl. No. 11/219,067, filed Jul. 24, 2006.

Office Action dated Jun. 5, 2008 in U.S. Appl. No. 11/514,117, filed Aug. 30, 2006.

Office Action dated Jul. 11, 2008 in U.S. Appl. No. 11/367,020, filed Mar. 2, 2006.

"U.S. Appl. No. 11/543,515, filed Oct. 24, 2006, Micron Ref. No. 2005-1173.00/US."

Ex Parte Cantell, unpublished decision of the Board of Patent Appeals and Interferences, Mar. 4, 2005.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

PCT International Search Report and Written Opinion, PCT Application No. PCT/US2008/081380 filed Oct. 27, 2008, Mar. 17, 2009.

Sheats et al., "Microlithography: Science and technology," Marcel Dekkar, Inc., pp. 104-105, 1998.

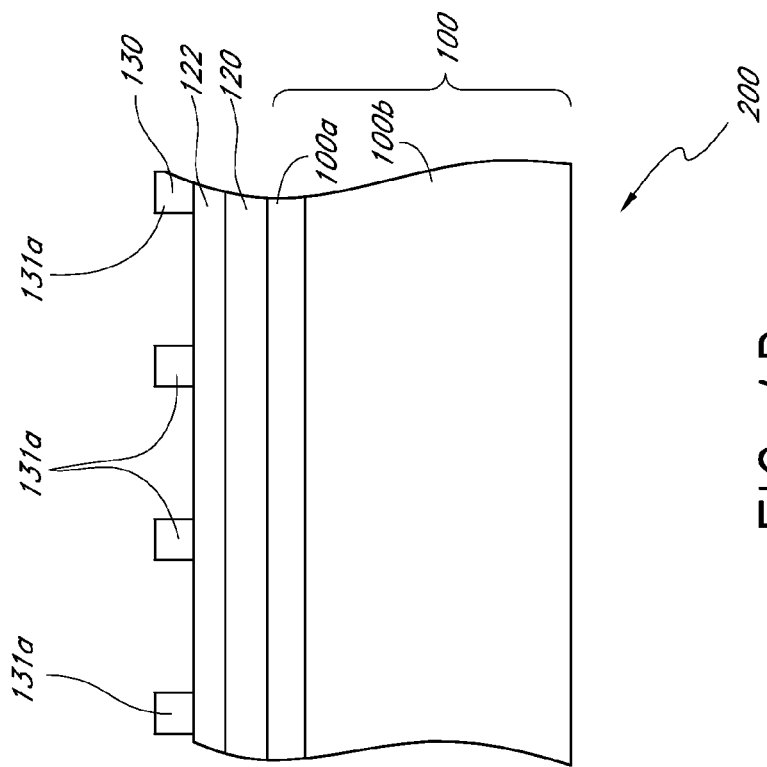
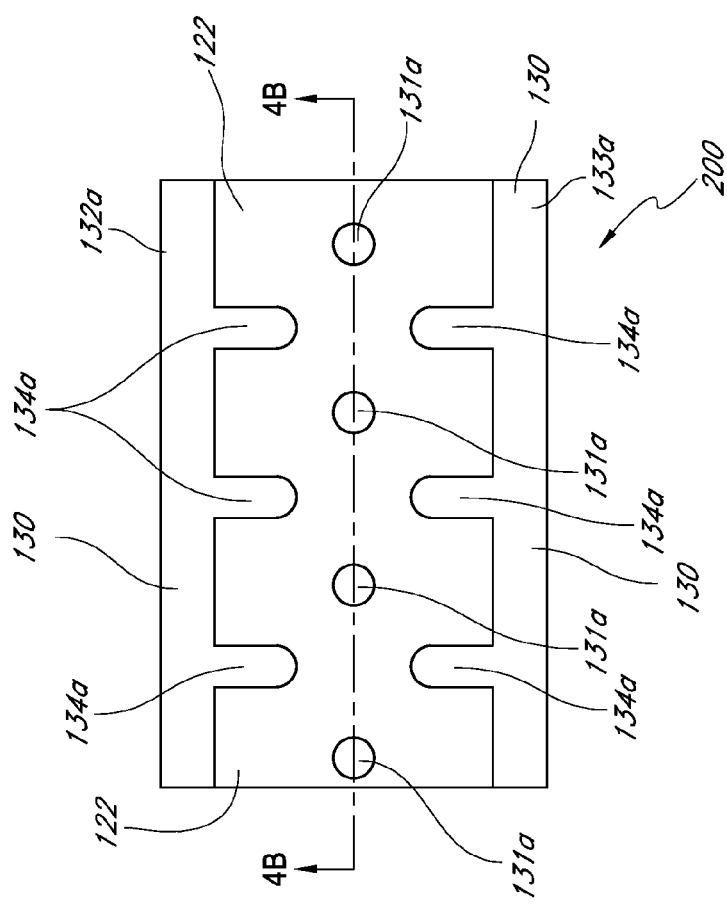

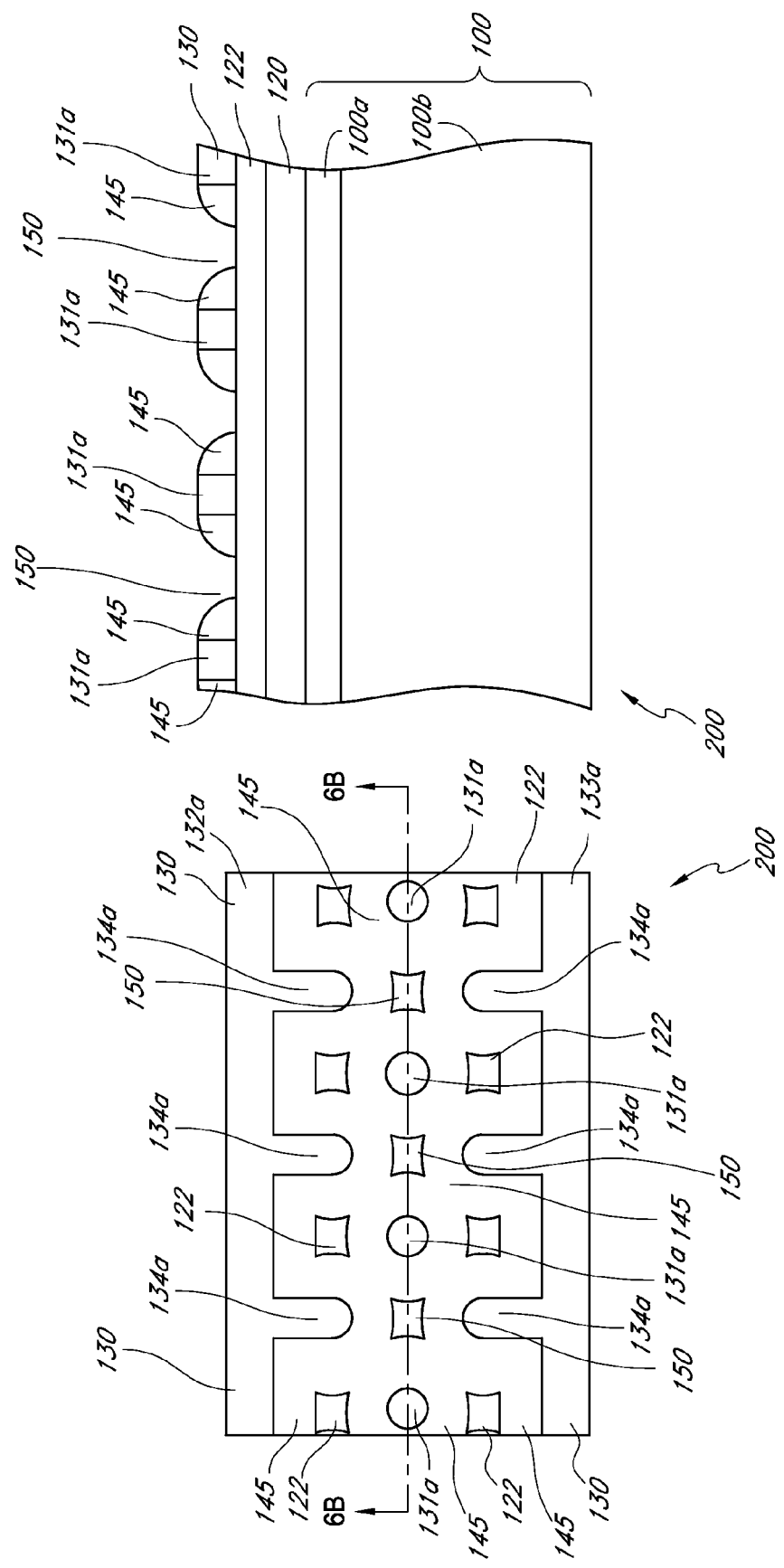

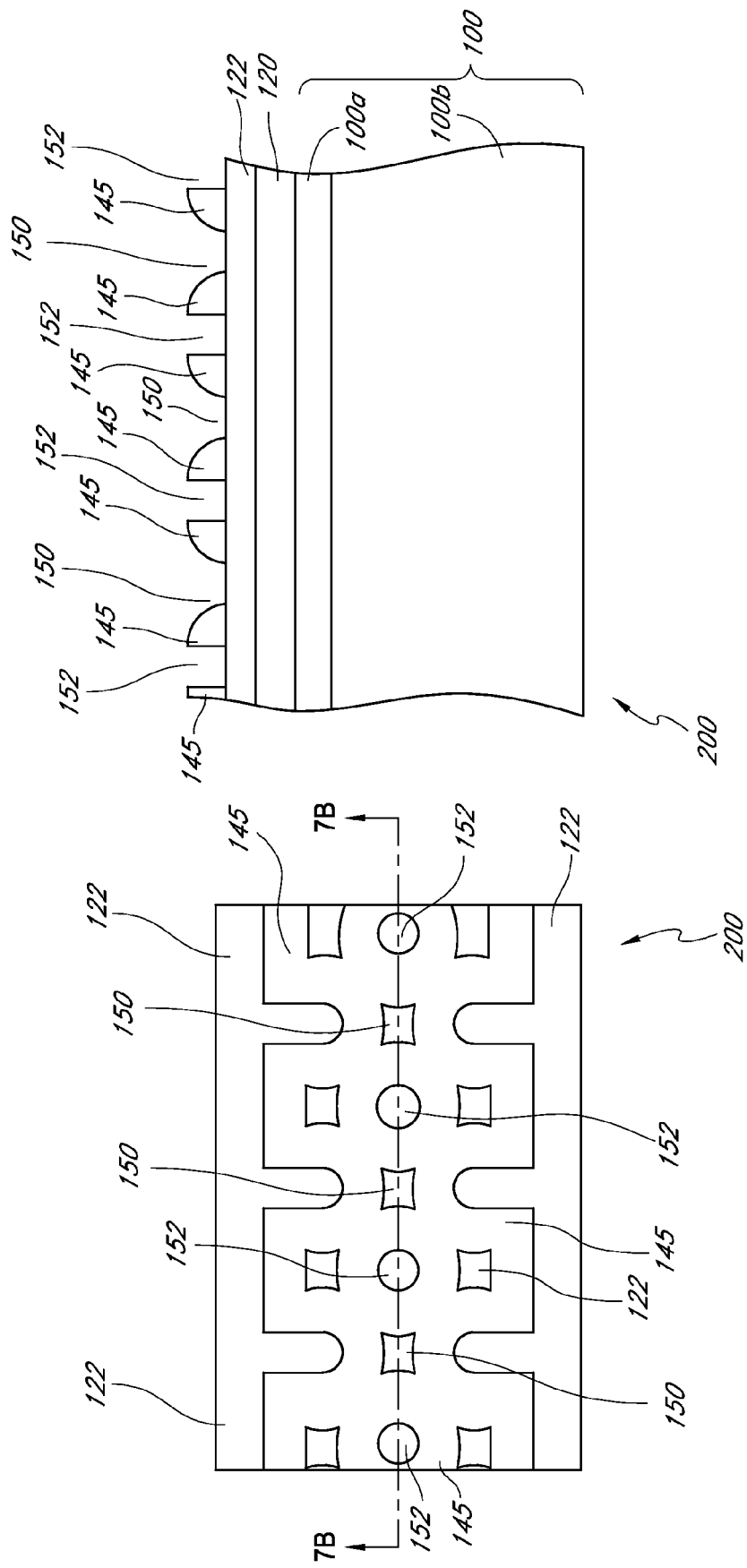

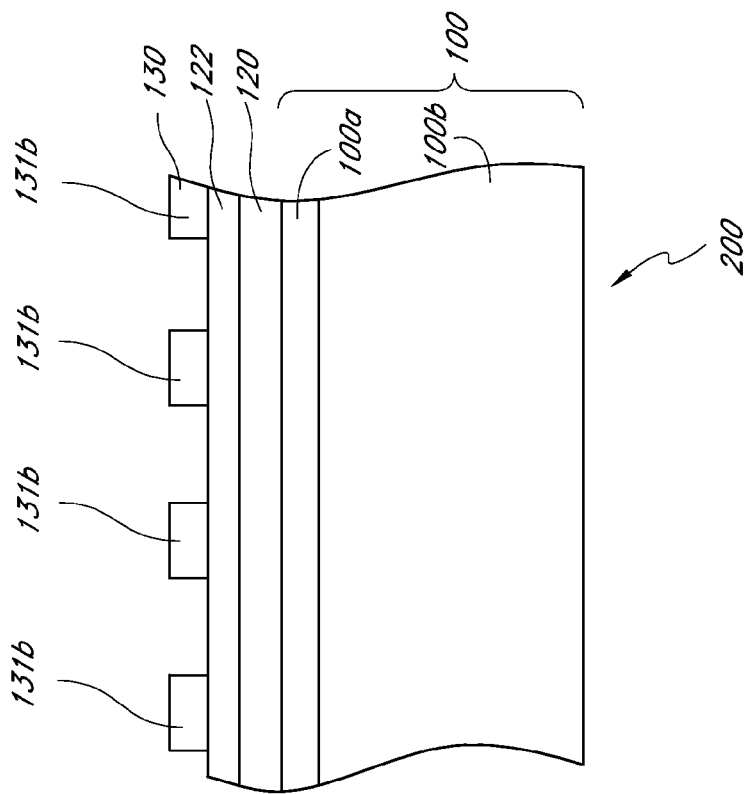
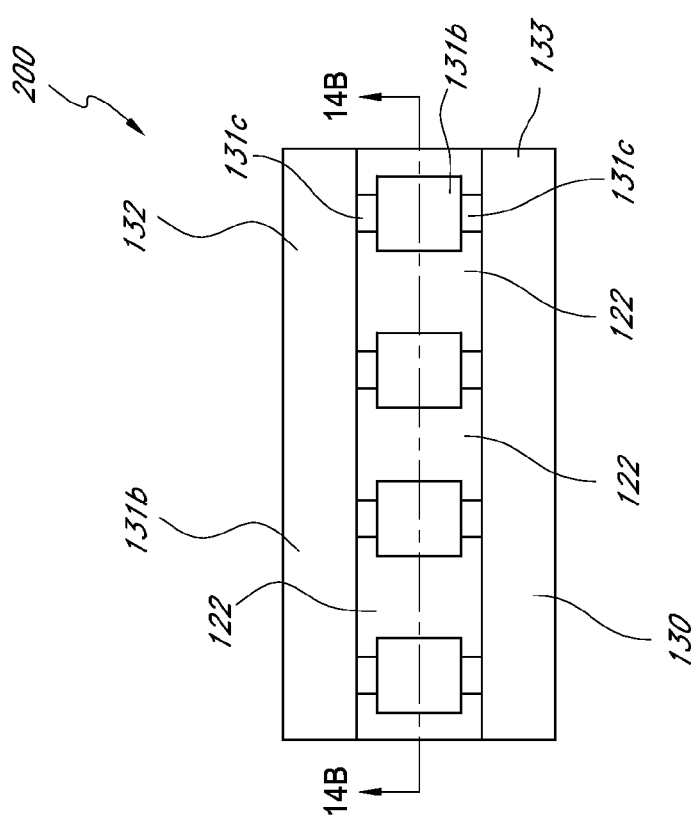
FIG. 14A
FIG. 14B

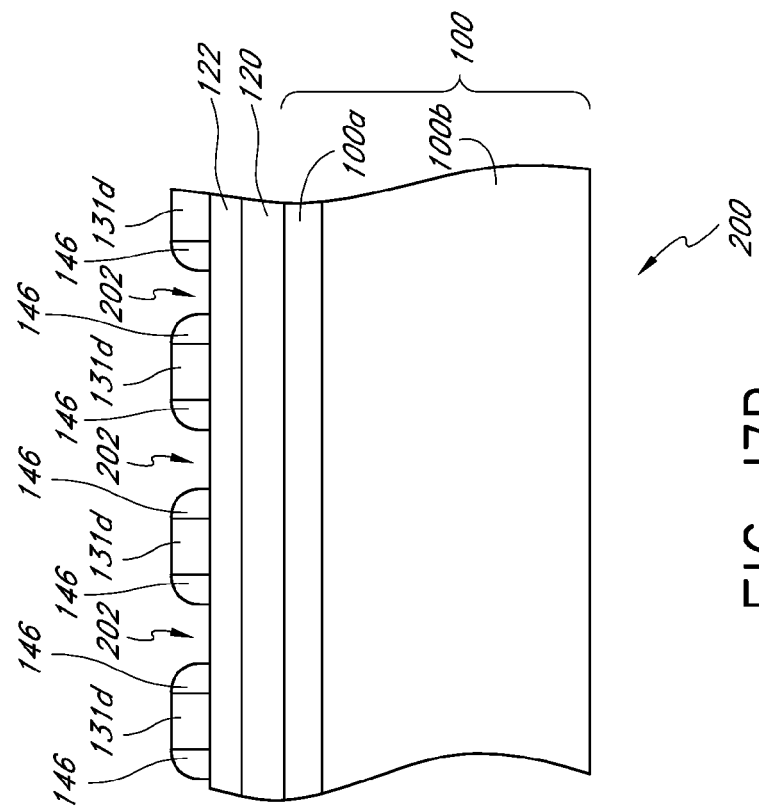
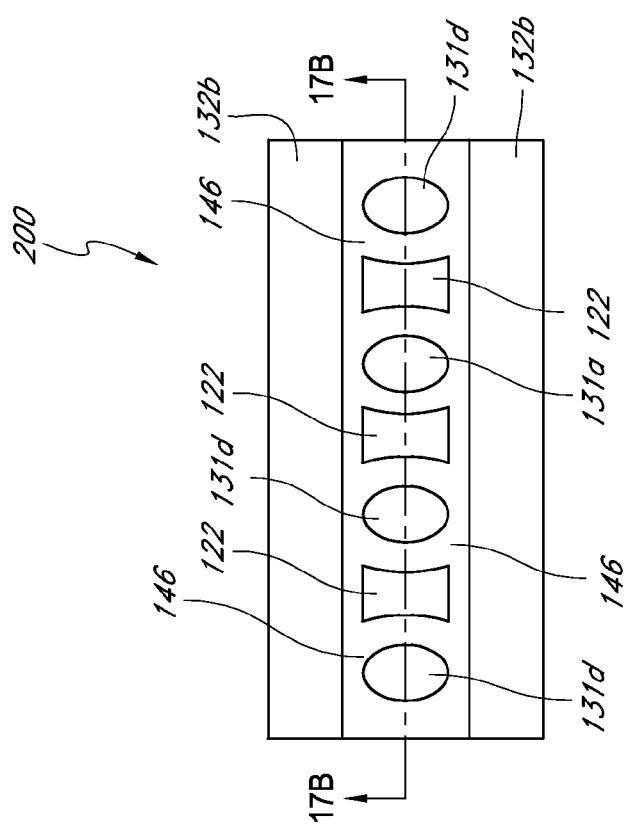
FIG. 17B
FIG. 17A ced circuit of FIG. 5A after etching the spacer material in

SPACER PROCESS FOR ON PITCH CONTACTS AND RELATED STRUCTURES

CROSS-REFERENCE TO RELATED APPLICATIONS

This application is a continuation of U.S. patent application Ser. No. 12/781,681, filed May 17, 2010, which is a divisional of U.S. patent application Ser. No. 11/933,664, filed Nov. 1, 2007 (now U.S. Pat. No. 7,737,039, issued Jun. 15, 2010), the entire disclosures of each of which are hereby incorporated herein by reference.

BACKGROUND OF THE INVENTION

1. Field of the Invention

Embodiments of the invention relate to semiconductor processing and, more particularly, to masking techniques.

2. Description of the Related Art

There is a constant demand to decrease the sizes of integrated circuits. This decrease can be facilitated by reducing the sizes and separation distances between the individual elements or electronic devices forming the integrated circuits. This process of reducing the sizes of features and the separation distances between features can increase the density of circuit elements across a substrate and is typically referred to as "scaling." As a result of the continuing demand for smaller integrated circuits, there is a constant need for methods and structures for scaling.

BRIEF DESCRIPTION OF THE DRAWINGS

The appended drawings are schematic, not necessarily drawn to scale, and are meant to illustrate and not to limit embodiments of the invention.

FIG. 4A illustrates a top view of the partially formed integrated circuit of FIG. 3A after the pattern of mandrels has been trimmed in accordance with embodiments of the invention.

FIG. 4B illustrates a cross-sectional side view of the partially formed integrated circuit of FIG. 4A along the sectional line 4B shown in FIG. 4A in accordance with embodiments of the invention.

FIG. 6A illustrates a top view of the partially formed integrated circuit of FIG. 5A after etching the spacer material in accordance with embodiments of the invention.

FIG. 6B illustrates a cross-sectional side view of the partially formed integrated circuit of FIG. 6A along the sectional line 6B shown in FIG. 6A in accordance with embodiments of the invention.

FIG. 7A illustrates a top view of the partially formed integrated circuit of FIG. 6A after etching mandrels in accordance with embodiments of the invention.

FIG. 7B illustrates a cross-sectional side view of the partially formed integrated circuit of FIG. 7A along the sectional line 7B shown in FIG. 7A in accordance with embodiments of the invention.

FIG. 14A illustrates a top view of a partially formed integrated circuit after forming a pattern of mandrels in accordance with embodiments of the invention.

FIG. 14B illustrates a cross-sectional side view of the partially formed integrated circuit of FIG. 14A along the sectional line 14B shown in FIG. 14A in accordance with embodiments of the invention.

FIG. 17A illustrates a top view of the partially formed integrated circuit of FIG. 16A after etching the spacer material in accordance with embodiments of the invention.

FIG. 17B illustrates a cross-sectional side view of the partially formed integrated circuit of FIG. 17A along the sectional line 17B shown in FIG. 17A in accordance with embodiments of the invention.

DETAILED DESCRIPTION OF THE PREFERRED EMBODIMENT

Figure 1:
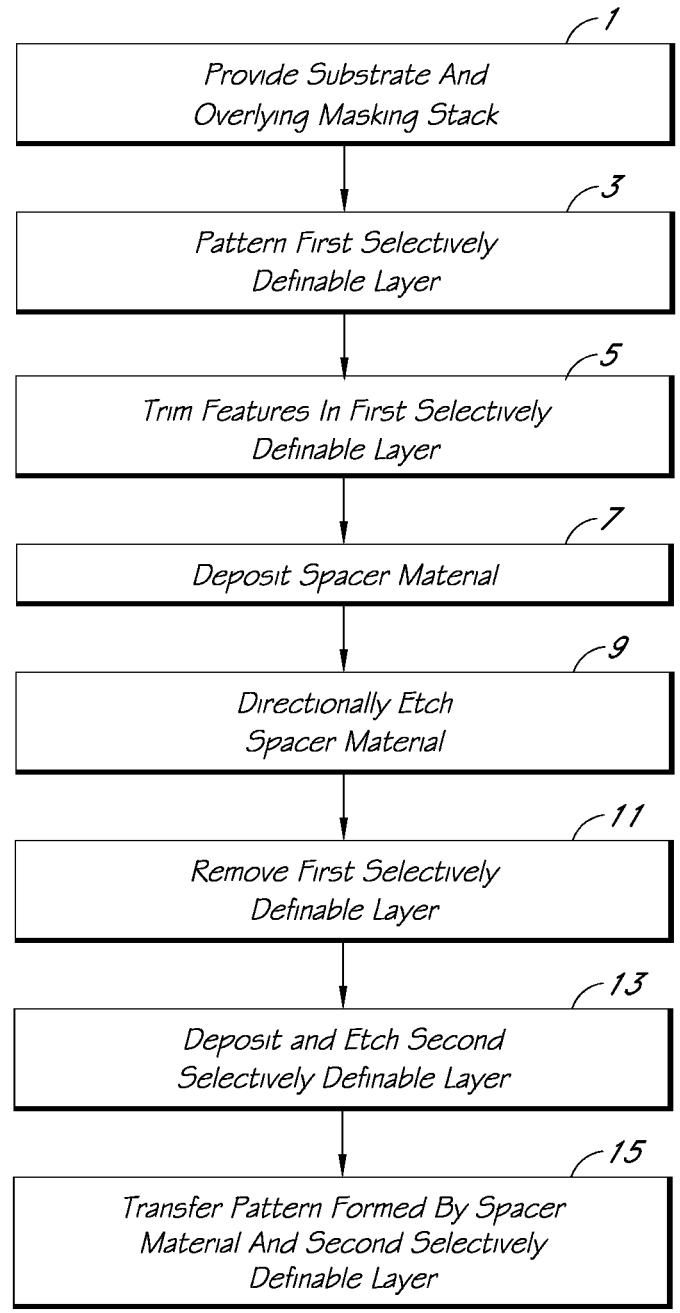
FIG. 1 is a flow chart illustrating a process in accordance with embodiments of the invention.

Embodiments of the invention provide methods of forming patterns of isolated features, such as holes or isolated pillars, having a high density. Advantageously, the holes or isolated pillars can be used to form conductive contacts to various features in integrated circuits. For example, contacts can be made to conductive interconnects having a close spacing, or small pitch, e.g., a pitch of about 60 nm or less, or about 30 nm or less. It will be appreciated that pitch is defined as the distance between an identical point in two neighboring interconnects, which are typically spaced apart by a material, such as an insulator. As a result, pitch may be viewed as the sum of the width of a feature and of the width of the space on one side of the feature separating that feature from a neighboring feature.

It will also be appreciated that interconnects with a small pitch present difficulties for forming contacts. Interconnects with small pitches can be formed by pitch multiplication, such as described in U.S. Pat. No. 7,253,118, issued Aug. 7, 2007, entitled PITCH REDUCED PATTERNS RELATIVE TO PHOTOLITHOGRAPHY FEATURES, the entire disclosure of which is incorporated by reference herein. Because of the close spacing between interconnects with small pitches, relatively large contacts can cause shorts between neighboring interconnects. Moreover, the relatively large cross-sectional areas of some contacts make difficult the formation of "on pitch" contacts, that is, contacts with the same pitch as the interconnects. Instead, contacts are typically formed staggered, with odd numbered contacts forming one row and even numbered contacts forming another row of contacts. These staggered contacts use space inefficiently due to their staggered nature and, as a result, present an obstacle to further integrated circuit miniaturization and scaling.

Advantageously, one or more embodiments of the invention allow the formation of contacts that are on pitch. The on pitch contacts advantageously are aligned in a row, allowing for a more efficient use of space. Moreover, the advantageously small sizes of the contacts decrease the occurrence of electrical shorts between neighboring interconnects and neighboring contacts.

The contacts can be patterned using a mask defined or derived from spacers. In some embodiments of the invention, a method is provided for increasing the density of patterned features by a multiple of about 1.5 or more. A row of sacrificial mandrels is formed having a linear density Z. The mandrels can be, e.g., free-standing spacers formed in, e.g., a photoresist layer. Additional mask features are defined between the mandrels by forming spacers at sides of the mandrels. The spacers can be formed by blanket depositing spacer material over the mandrels and then etching the spacer material, thereby forming the spacers at the sides of the mandrels. The mandrels are removed, thereby forming a mask pattern using the spacers, the mask pattern having a density of holes of about 1.5 Z or more. The contacts are advantageously transferred to a substrate, to, e.g., define conductive contacts to electrical features such as interconnects. It will be appreciated that the substrate can form various electronic devices, including integrated circuits such as memory devices, including nonvolatile memory such as flash memory.

Reference will now be made to the Figures, in which like numerals refer to like parts throughout.

FIG. 1 illustrates a general sequence of process steps according to some embodiments of the invention. In step 1 of FIG. 1, a substrate is provided. The substrate can comprise a plurality of different materials, including insulating, semiconducting and conducting materials, which can be etched through an overlying mask. A masking stack comprising a first selectively definable layer is provided overlying the substrate.

With continued reference to FIG. 1, in step 3, a pattern is formed in the first selectively definable layer. In some embodiments, a plurality of mandrels, such as pillars, are in a row in the first selectively definable layer. The mandrels can be formed by photolithography, by selectively exposing photoresist to light and then developing the photoresist to leave a pattern of pillars composed of the photoresist. As used herein, "forming" a structure includes performing steps to make the structure or providing the structure already premade. In step 5, the features defining the pattern in the first selectively definable layer are optionally trimmed to a desired size. In step 7, spacer material is formed on and around the mandrels while leaving a pattern of openings between the mandrels. In step 9, the spacer material is etched to form a pattern of holes completely open to an underlying material. In step 11, the mandrels and, optionally, the entirety of the first selectively definable layer, are removed to form further holes, thus providing a pattern of holes with a density greater than the mandrels originally formed in the first selectively definable layer.

In step 13, a second selectively definable layer is provided. The second selectively definable layer can be formed over the spacers and then patterned. It will be appreciated that forming contacts typically entails forming a row of contact features. As a result, in some embodiments, only a row of holes formed by the spacers is transferred to an underlying substrate. The second selectively definable layer is used to block pattern transfer of particular parts of the spacer pattern. For example, the second selectively definable layer can be patterned such that only a single row of holes defined be spacers is exposed for pattern transfer to underlying materials.

With continued reference to FIG. 1, in step 15, the pattern formed by the combination of the spacer material and the second selectively definable layer is transferred to an underlying material. It will be appreciated that the underlying material may be the substrate, or, in some embodiments, may be additional masking layers. If additional masking layers are present, the pattern may be transferred to the underlying substrate after transfer to the additional masking layers.

Figure 2:
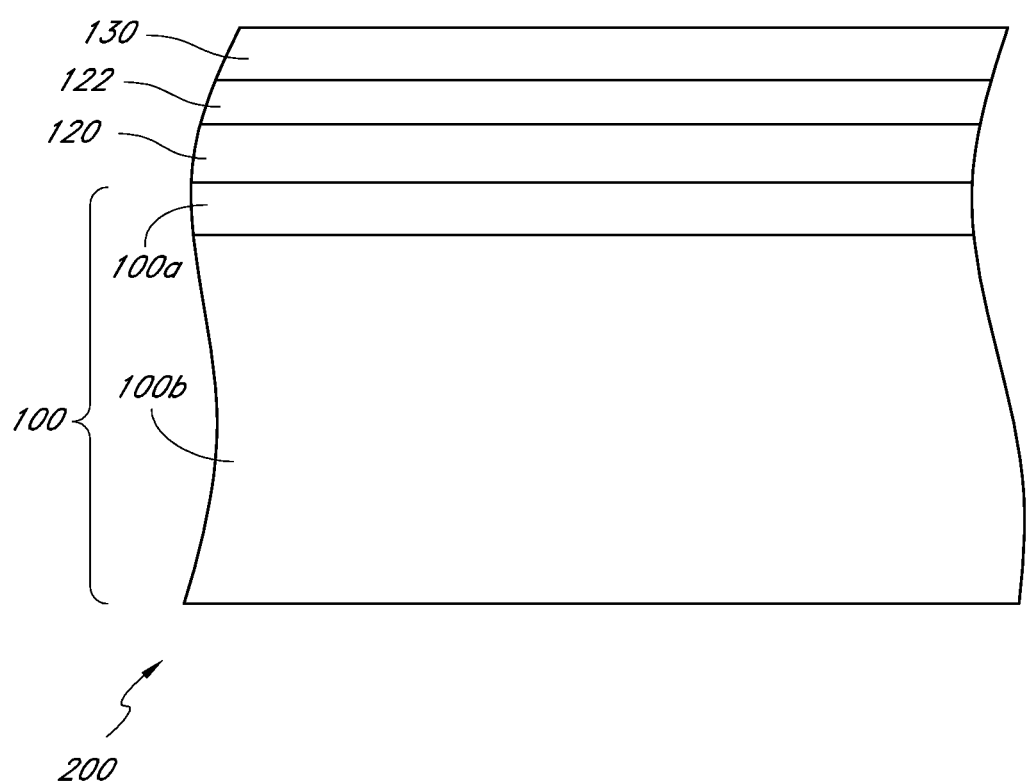
FIG. 2 illustrates a cross-sectional side view of a partially formed integrated circuit having a stack of masking layers overlying a substrate in accordance with embodiments of the invention.

The sequence of FIG. 1 will now be described in greater detail with reference to cross-sectional and top plan views, in accordance with some embodiments of the invention. With reference to FIGS. 1 and 2, in step 1, a substrate 100 is provided and a masking stack, including layers 120-130 is provided thereover. The substrate 100 and the masking stack form a partially formed integrated circuit 200. The substrate 100 may include one or more of a variety of suitable workpieces for semiconductor processing. For example, the substrate 100 can include a silicon wafer. As illustrated, the substrate 100 can include various layers of materials, including the layers 100a and 100b. Layer 100a can be a dielectric, in which contacts can be formed. The layer 100b can include a single material, or can include various other materials and features, such as pitch-multiplied interconnects, to which contacts in the layer 100a can electrically contact.

In one or more embodiments, the first hard mask layer 120, also referred to as the primary mask layer, is formed of amorphous carbon, e.g., transparent carbon, which has been found to have excellent etch selectivity with other materials of the illustrated imaging or masking stack. Methods for forming amorphous carbon are disclosed in A. Helmbold, D. Meissner, Thin Solid Films, 283 (1996) 196-203, the entire disclosures of which are hereby incorporated herein by reference. In the illustrated embodiment, a second hard mask layer 122 is also formed over the first hard mask layer 120 to protect the first hard mask layer 120 during etching in later steps and/or to enhance the accuracy of forming patterns by photolithography. In one or more embodiments, the second hard mask layer 122 includes an anti-reflective coating (ARC), such as DARC or BARC/DARC, which can aid photolithography by preventing undesired light reflections.

With continued reference to FIG. 2, a selectively definable layer 130 is formed on the second hard mask layer 122. The selectively definable layer 130 can be formed using a photoresist in accordance with well-known processes for providing masks in semiconductor fabrication. For example, the photoresist can be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, can be used to define the selectively definable layer 120. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the selectively definable layer 130 and any subsequent resist layers can be formed of a resist that can be patterned by nanoimprint lithography, e.g., by using a mold or mechanical force to pattern the resist.

Figure 3B:
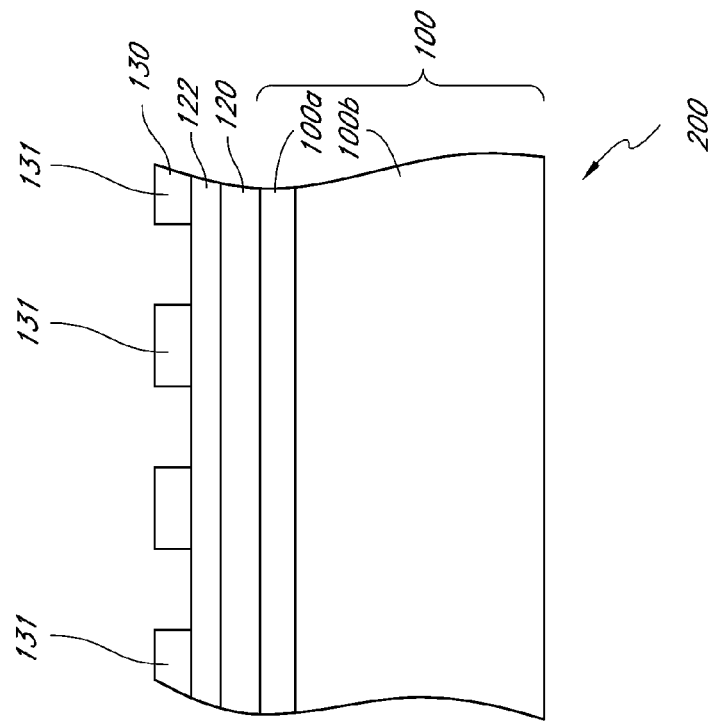
FIG. 3B illustrates a cross-sectional side view of the partially formed integrated circuit of FIG. 3A along the sectional line 3B shown in FIG. 3A in accordance with embodiments of the invention.
Figure 3A:
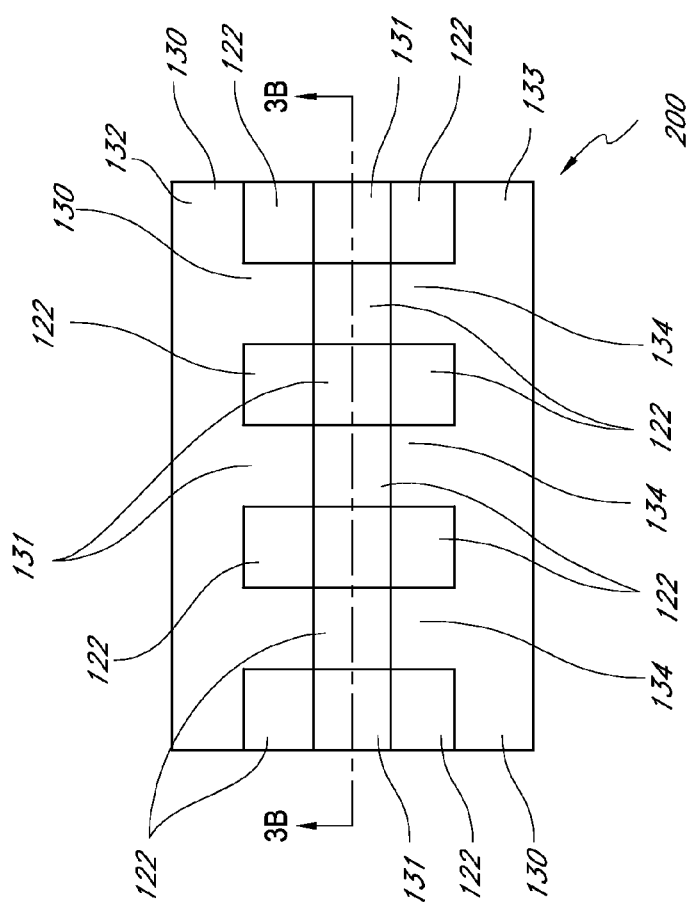
FIG. 3A illustrates a top view of a partially formed integrated circuit, having a pattern of mandrels in accordance with embodiments of the invention.

With reference to FIGS. 3A and 3B, a partially formed integrated circuit 200 is illustrated after step 3 (FIG. 1) has been carried out. As shown in FIGS. 3A and 3B, the selectively definable layer 130 is patterned to expose parts of the second hard mask layer 122. The pattern in the selectively definable layer 130 includes a plurality of mandrels 131, first and second blocks 132, 133 on either side of the mandrels 131, and sacrificial features 134 in contact with and extending from the first and second blocks 132, 133 to the mandrels 131. Thus, as illustrated, the mandrels 131 and features 134 are aligned in rows and form a checkerboard pattern between the first and second blocks 132, 133. The features 134 in contact with the first block 132 may be considered to form a first row of the checkerboard pattern, the features 134 in contact with the second block 133 may be considered to form a second row, and the mandrels 131 may be considered to form a third row of the checkerboard pattern.

The selectively definable layer 130 can be patterned using photolithography. Due to limitations of typical optical systems, it will be appreciated that conventional photolithographic methods can have difficulties forming free-standing mandrels 131 in isolation. Advantageously, in some embodiments, the first and second blocks 132, 133 and the features 134 can be used to facilitate formation of the mandrels 131.

In some embodiments, the sizes of the mandrels 131 are substantially equal to the minimum feature size formable using the lithographic technique used to pattern the layer 130. In some other embodiments, the mandrels 131 can be formed larger than the minimum feature size formed by photolithography, in order to enhance the accuracy of the patterns formed by photolithography. It will be appreciated that photolithographic techniques typically can more easily and accurately form features having sizes above the size limit of the technique.

Where the sizes and/or shapes of the mandrels 131 are larger or different from that desired, the mandrels 131 are optionally trimmed. The trim reduces the sizes of the mandrels, in addition to rounding the corners of the mandrels. FIGS. 4A and 4B illustrate the partially formed integrated circuit 200 after step 5 of FIG. 1 has been carried out. In step 5, the selectively definable layer 130 is trimmed, such as by subjecting the selectively definable layer 130 to $O_2/Cl_2$ or $O_2/HBr$ plasma, to form trimmed mandrels 131a. It will be appreciated that the trim also trims the features 134 to form trimmed features 134a and also trims the blocks 132, 133 to form trimmed blocks 132a, 133a. Thus, the trimming step 5 can advantageously provide a feature size that is less than the minimum feature size formable using the lithographic technique used to pattern the selectively definable layer 130. In some embodiments, the mandrels 131 are trimmed to a size substantially equal to the size of the holes 150 (FIGS. 6A and 6B) that will later be formed. In the illustrated embodiments, the trim leaves the mandrels 131a with a circular cross-sectional shape, as seen from the top down view in FIG. 4A. Advantageously, in some embodiments, the mandrels 131a have a width of about 60 nm or less, or about 30 nm or less, and are spaced by about 60 nm or less, or about 30 nm or less.

Figures 5A, 5B:
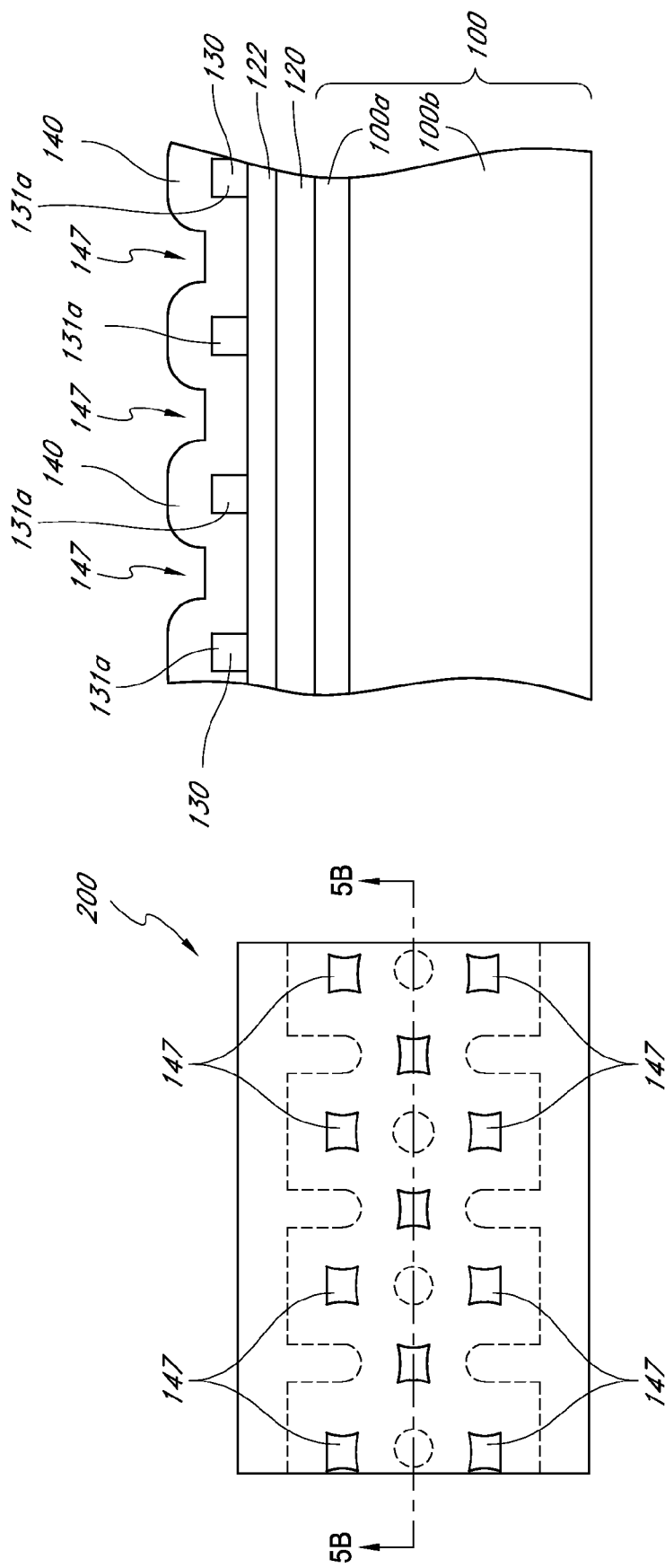
FIG. 5A illustrates a top view of the partially formed integrated circuit of FIG. 4A during deposition of a spacer material on pillars in accordance with embodiments of the invention.
FIG. 5B illustrates a cross-sectional side view of the partially formed integrated circuit of FIG. 5A along the sectional line 5B shown in FIG. 5A in accordance with embodiments of the invention.

With reference to FIGS. 5A and 5B, in step 7 of FIG. 1, a layer 140 of spacer material is blanket deposited on the mandrels 131a, sacrificial features 134a, and first and second blocks 132a, 133a. The spacer material is selectively etchable with respect to the material of the mandrels 131a and other exposed surfaces. In some embodiments, the spacer material is an oxide such as silicon oxide. Examples of other spacer materials include silicon nitride, $Al_2O_3$, TiN, etc. In one or more embodiments, deposition of the spacer material is accomplished by chemical vapor deposition. In other embodiments, particularly where selectively definable layer 130 is formed of photoresist or other material sensitive to high temperature, the spacer material layer 140 is deposited by atomic layer deposition, which can be performed at relatively low temperatures. It will be appreciated that photoresist can be damaged or deformed by exposure to high temperatures and atomic layer deposition can be performed at temperatures compatible with photoresist.

In some embodiments, the pattern in the selectively definable layer 130 can be transferred to one or more underlying layers before depositing the layer 140 of spacer material. For example, in embodiments where exposure and resistance to high temperatures is desired (e.g., where the material for the layer 140 requires a high temperature deposition), the pattern in the selectively definable layer 130 can be transferred to a more high temperature resistant material before deposition of the layer 140. For example, the pattern can be transferred to an additional underlying layer of sufficiently temperature resistant material.

With continued reference to FIGS. 5A and 5B, it will be appreciated that the layer 140 is preferably conformal and assumes the general contours of the underlying topology. Thus, indentations 147 are formed between mandrels 131a.

In step 9 of FIG. 1, the layer 140 of spacer material is etched, preferably anisotropically etched, to expose the upper surfaces of the mandrels 131a and the second hard mask layer 122, as shown in FIGS. 6A and 6B. Thus, spacers 145 are formed at the sides of mandrels 131a. The spacers 145 define holes 150, which expose the second hard mask layer 122.

In step 11 of FIG. 1, the mandrels 131a are removed by selectively etching the selectively definable layer 130 (FIGS. 6A and 6B) relative to the spacers 145 as shown in FIGS. 7A and 7B. Thus, holes 152 are formed at the locations formerly occupied by the mandrels 131a. At this stage, a pattern of holes 150, 152 have been formed. It will be appreciated that the mandrels 131a, formed in a row, had a linear density of Z. The spacers 145 define holes 150 between themselves. Thus, for every two mandrels 131a, a hole 150 is formed. As a result, the linear density of the holes is preferably at least 1.5 Z. It will be appreciated that the multiplier 1.5 increases as the number of mandrels 131a increase. For example, six mandrels 131a will result in at least five holes 150, such that the multiplier approaches or is about two as the Z increases.

Figures 8A, 8B:
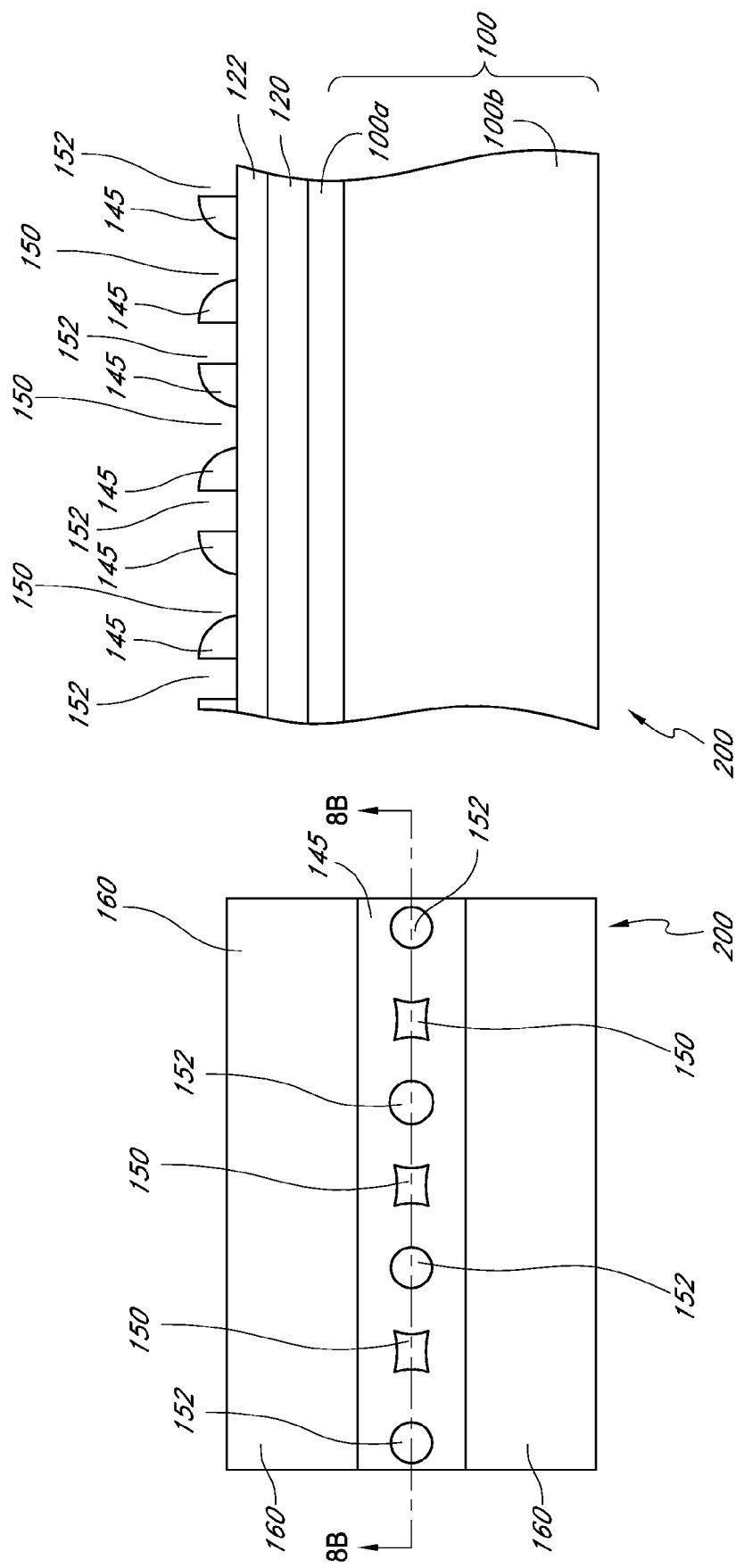
FIG. 8A illustrates a top view of the partially formed integrated circuit of FIG. 8A after forming a secondary mask in accordance with embodiments of the invention.
FIG. 8B illustrates a cross-sectional side view of the partially formed integrated circuit of FIG. 8A along the sectional line 8B shown in FIG. 8A in accordance with embodiments of the invention.

In step 13 of FIG. 1, a second selectively definable layer 160 is formed over and around the spacers 145. The second selectively definable layer 160 is then patterned, as shown in FIGS. 8A and 8B. In some embodiments, the second selectively definable layer 160 is formed of photoresist. The second selectively definable layer can be formed of the same types of materials as the first selectively definable layer 130, including the same photoresist. In other embodiments, a material different from that of the layer 130 may be used.

In some embodiments, only a single row of holes 150, 152 is desired to form on pitch contacts. As a result, the second selectively definable layer 160 is patterned to allow transfer of only the row of holes 150, 152 to underlying layers. As illustrated, the patterned layer 160 leaves the row of holes 150, 152 exposed for pattern transfer.

Figure 9:
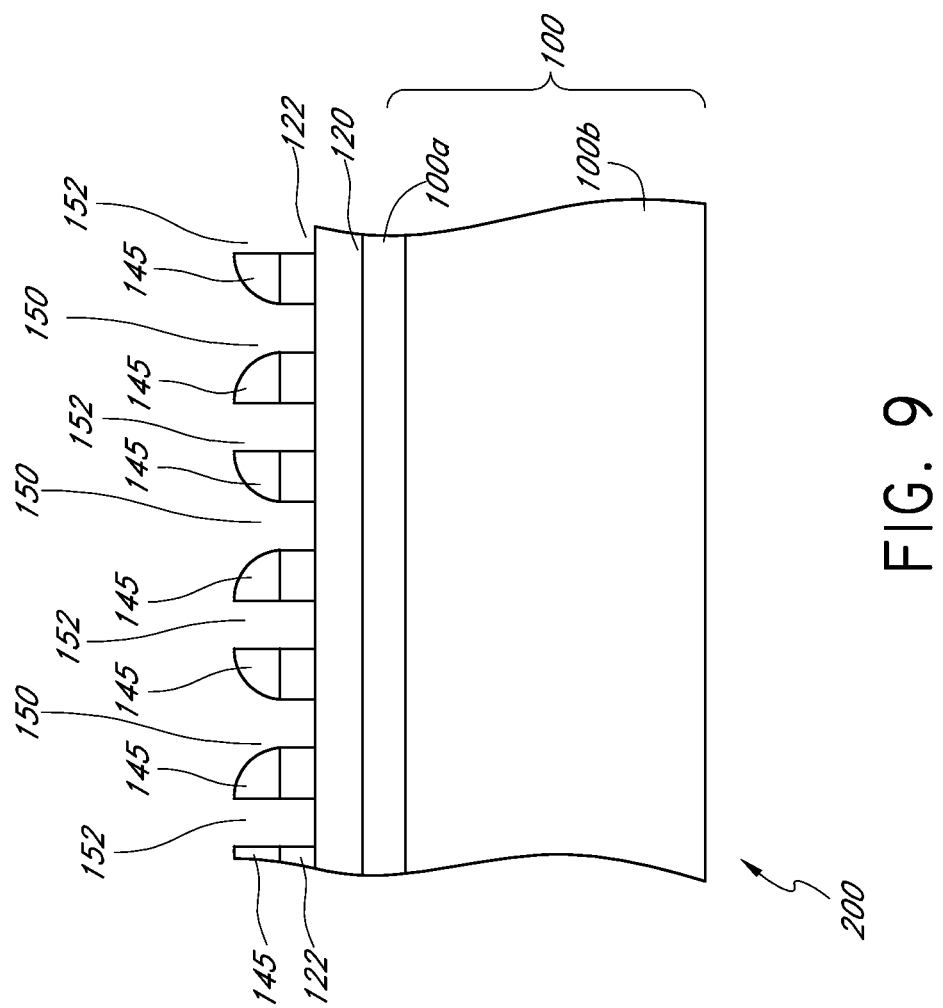
FIG. 9 illustrates a cross-sectional side view of the partially formed integrated circuit of FIG. 8A after a pattern transfer to an underlying layer in accordance with embodiments of the invention.

In step 15, the pattern defined by the spacers 145 and the second selectively definable layer 160 is transferred to underlying materials, e.g., using anisotropic etches selective for the material forming an underling layer relative to other exposed materials. With reference to FIG. 9, the pattern is transferred to the second hard mask layer 122.

Figure 10:
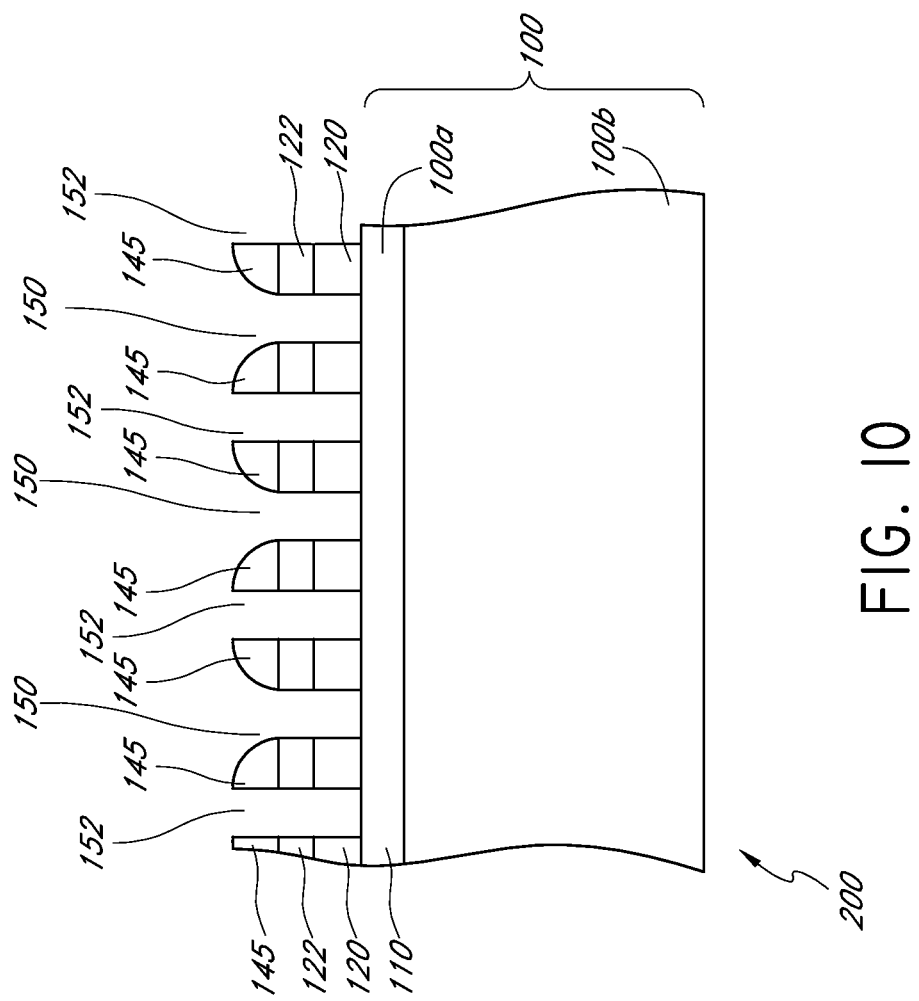
FIG. 10 illustrates a cross-sectional side view of the partially formed integrated circuit of FIG. 9 after another pattern transfer to a primary masking layer in accordance with embodiments of the invention.

With reference to FIG. 10, the pattern is then transferred to the first, or primary, hard mask layer 120. As noted above, the primary hard mask layer 120 is preferably formed of amorphous carbon, which has particular advantages in offering high etch selectivity relative to various silicon-containing materials, such as those of the partially formed integrated circuit 200. The primary masking layer 120 provides a robust mask for etching the underlying substrate 100.

Figure 11:
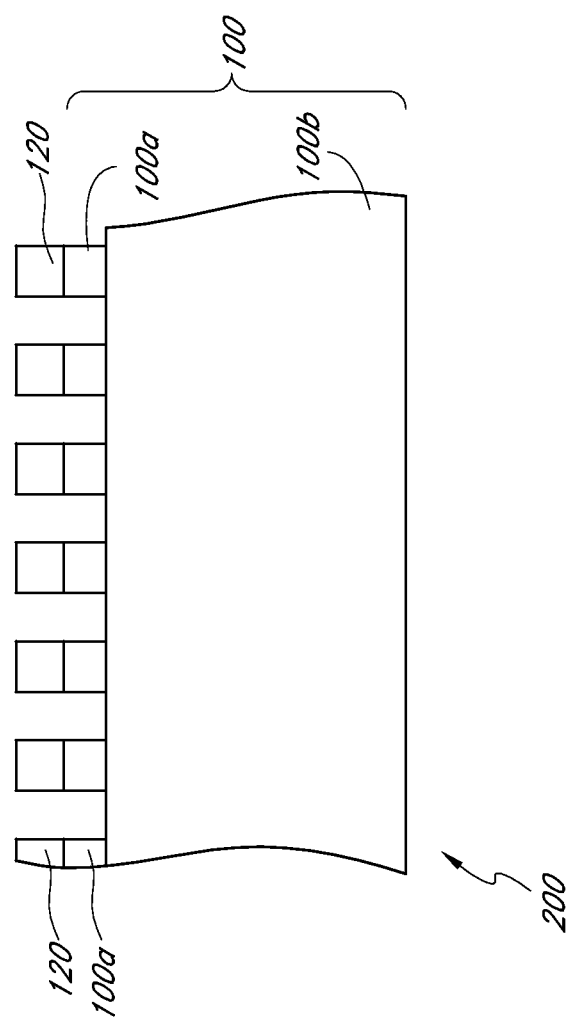
FIG. 11 illustrates a cross-sectional side view of the partially formed integrated circuit of FIG. 10 after a pattern transfer to the substrate in accordance with embodiments of the invention.

With reference to FIG. 11, the pattern originally defined by the spacers 145 and the second selectively definable layer 160 is transferred to layer 100a in the substrate 100. Depending upon the etch used and the identity of materials, the anisotropic etch used in some embodiments of the pattern transfer may remove some of the overlying materials, such as the spacers 145 and/or the second hard mask layer 122. In some embodiments, the layer 100a is formed of a dielectric, e.g., silicon oxide and transferring the holes 150, 152 to that layer 100a forms contacts vias. The holes 150, 152 expose conductive interconnects in some embodiments. The holes 150, 152 may be filled with conducting or semiconducting material to form contacts to the conductive interconnects (not shown).

Optionally, before the pattern transfer to the layer 100a, the mask formed by the primary hard mask layer 120 is cleaned. It will be appreciated that the etch used to transfer the pattern of holes 150, 152 to the primary hard mask layer 120 can cause undesired residue or polymerization. A wet organic strip etch can be used to clean the mask formed by the layer 120 by removing the residue or polymerization product before the pattern transfer to the underlying layer 100a.

It will be appreciated that wet organic strip etches may advantageously be applied to remove various exposed materials, such as carbon-based materials. As discussed herein, these organic strip etches include solvent based chemistries. In other embodiments, the strip etches or cleaning steps may include acidic or basic chemistries, as appropriate for the particular materials present and desired for removal, as known in the art.

Figure 12:
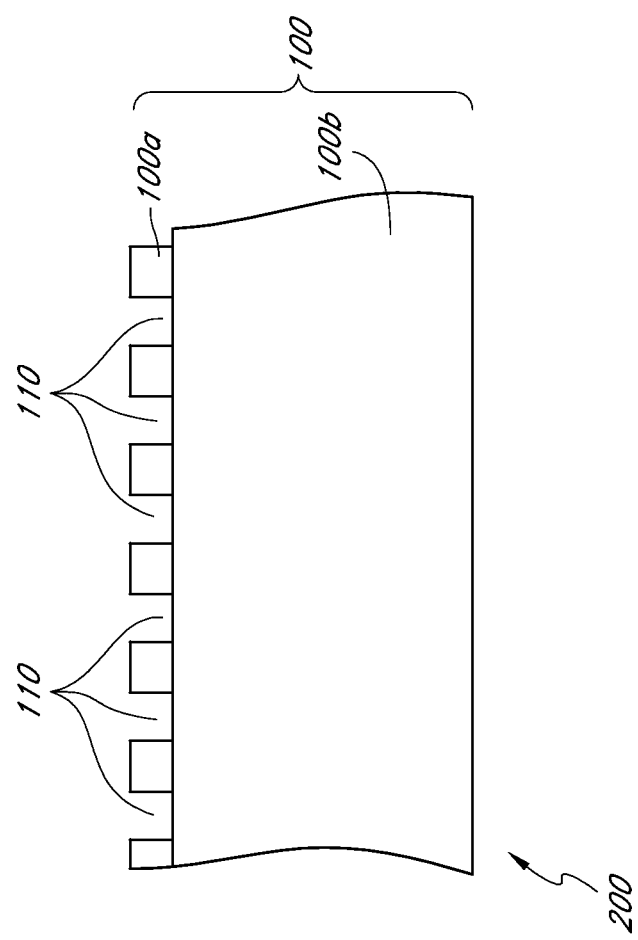
FIG. 12 illustrates a cross-sectional side view of the partially formed integrated circuit of FIG. 11 after removing masking layers overlying the substrate in accordance with embodiments of the invention.

With reference to FIG. 12, the overlying masking stack is removed. For example, in embodiments where the primary masking layer 120 is formed of amorphous carbon, the amorphous carbon can be stripped using a wet organic strip etch. Thus, a pattern of openings 110 are formed in the layer 110a. In some embodiments, material is subsequently deposited into the openings 110 to form, e.g., conductive contacts.

Figure 13:
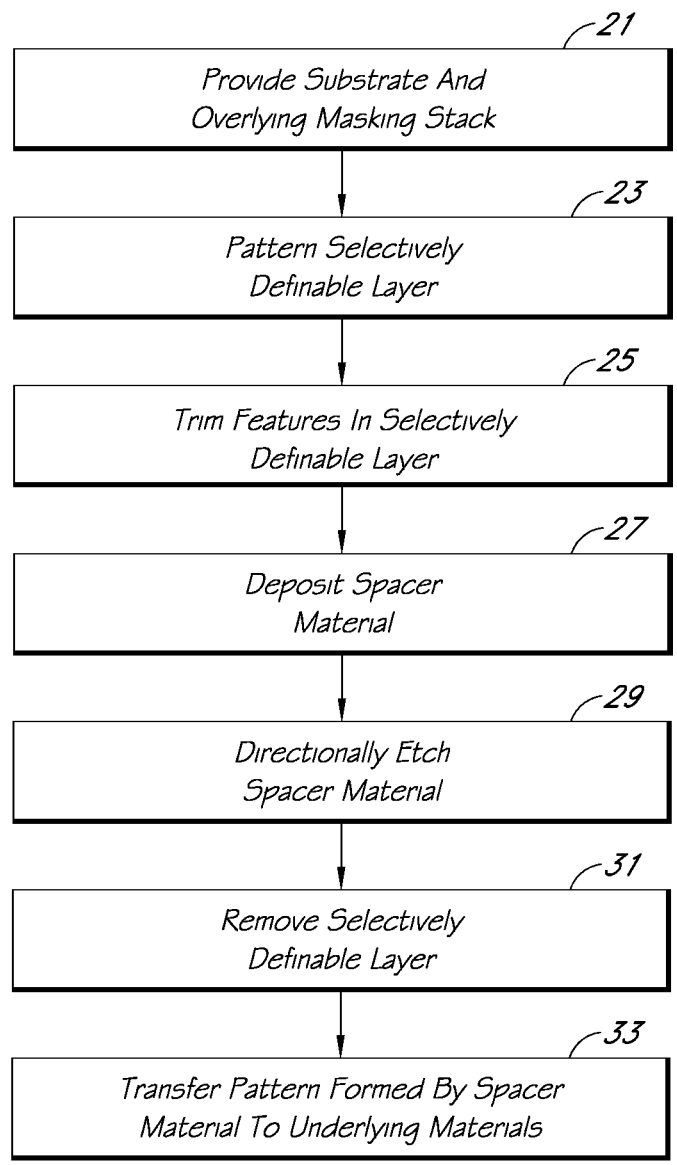
FIG. 13 is a flow chart illustrating processes in accordance with other embodiments of the invention.

FIG. 13 and the ensuing figures illustrate another sequence of process steps according to some other embodiments of the invention. It will be appreciated that the materials, etches and other details of the steps discussed above have application to this sequence.

In step 21 of FIG. 13, a substrate with an overlying masking stack is provided. The substrate is similar to that described above with reference to FIG. 2. In the illustrated embodiment, the substrate 100 includes a plurality of layers 100a, 100b of different materials, including a dielectric layer 100a. The overlying masking stack includes a plurality of layers to facilitate spacer formation and pattern transfer to the substrate 100. As illustrated, the masking stack includes a first, or primary, hard mask layer 120, a second hard mask layer 122 and a selectively definable layer 130.

In step 23 (FIG. 13), a pattern is formed in the first selectively definable layer, as illustrated in FIGS. 14A and 14B. A plurality of mandrels 131b is formed in a row in the first selectively definable layer 130 to expose parts of the second hard mask layer 122. In some embodiments, the mandrels 131b are formed by photolithography. The mandrels 131b can include end sections 131c, which are in contact with the first and second blocks 132, 133. The mid-sections of the mandrels 131b are wider than the end sections 131c, to facilitate photolithographic patterning of mandrels 131b which allow the formation of rounded mask holes 200 (FIG. 17A). Advantageously, formation of only a single row of features 131b allows formation of a row of on pitch contacts without use of a second selectively definable layer, such as the layer 160 (FIG. 8A), to block the transfer of neighboring mask features to underlying materials.

Figure 15B:
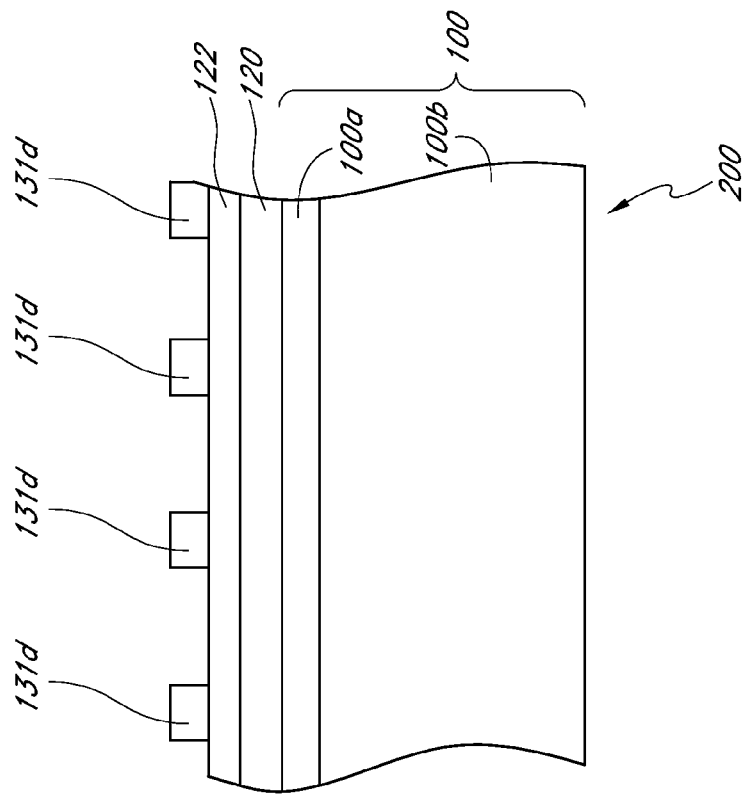
FIG. 15B illustrates a cross-sectional side view of the partially formed integrated circuit of FIG. 15A along the sectional line 15B shown in FIG. 15A in accordance with embodiments of the invention.
Figure 15A:
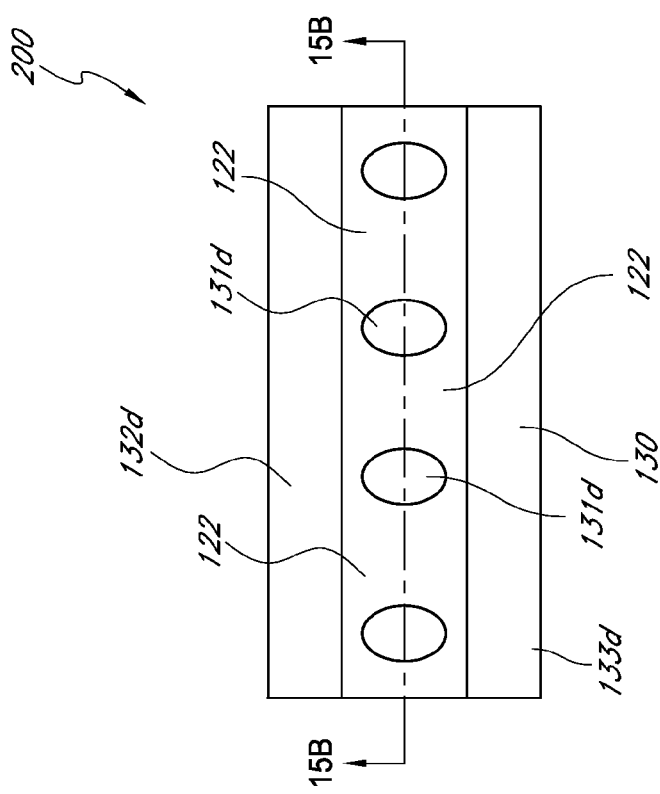
FIG. 15A illustrates a top view of the partially formed integrated circuit of FIG. 15A after the pattern of mandrels has been trimmed in accordance with embodiments of the invention.

In step 25 (FIG. 13), the pattern formed in the first selectively definable layer is optionally trimmed, as illustrated in FIGS. 15A and 15B. As noted above, the trim is advantageously applied where the sizes and/or shapes of the mandrels 131b are larger or different from that desired, since the trim reduces the sizes of the mandrels 131b, in addition to rounding the corners of the mandrels. The trim removes the end sections 131c, leaving trimmed mandrels 131d and trimmed first and second blocks 132d, 133d. The trim leaves the mandrels 131d with an oval cross-sectional shape, as seen from the top down view in FIG. 15A.

Figures 16A, 16B:
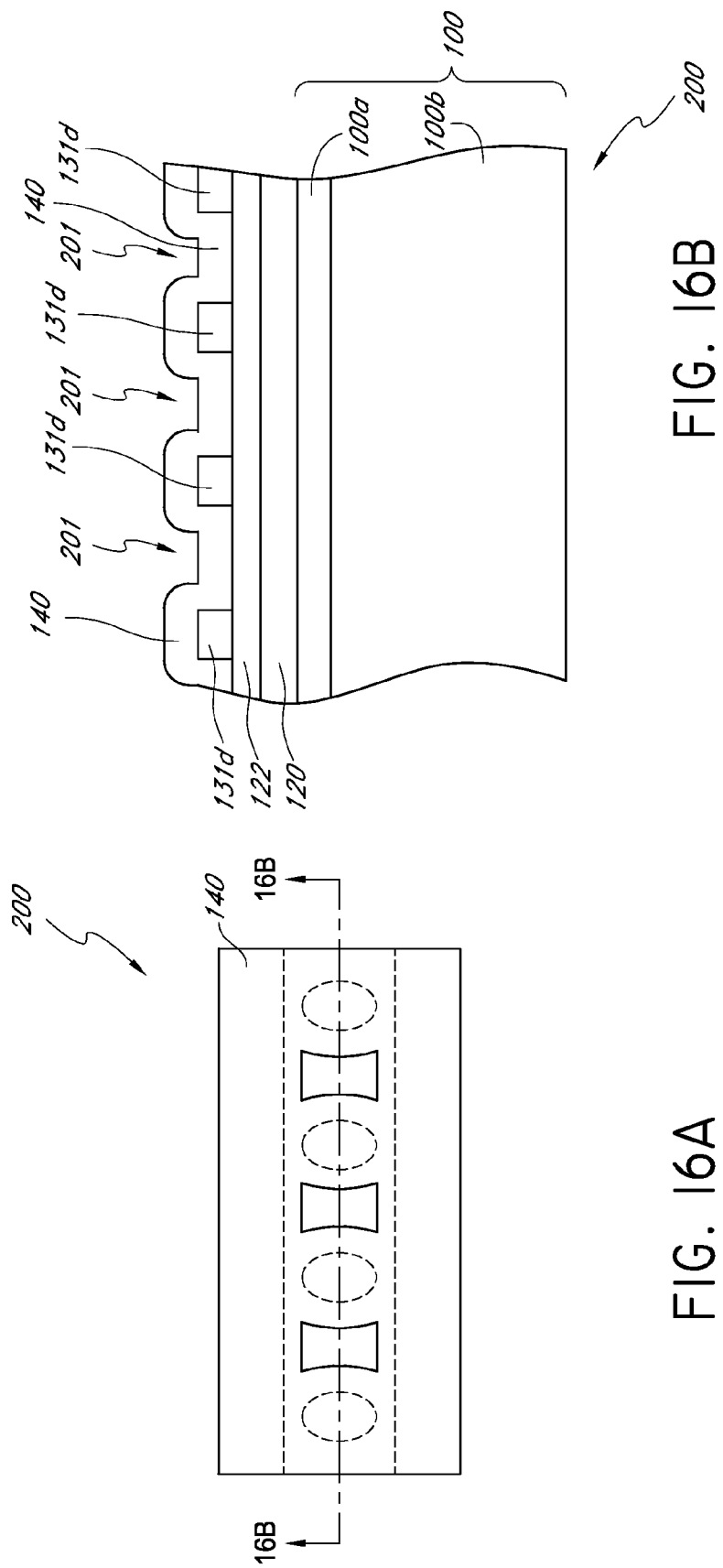
FIG. 16A illustrates a top view of the partially formed integrated circuit of FIG. 15A after deposition of a spacer material on pillars in accordance with embodiments of the invention.
FIG. 16B illustrates a cross-sectional side view of the partially formed integrated circuit of FIG. 16A along the sectional line 16B shown in FIG. 16A in accordance with embodiments of the invention.

With reference to FIGS. 16A and 16B, in step 27 of FIG. 13, spacer material layer 140 is blanket deposited on the mandrels 131d and on the first and second blocks 132d, 133d. In some other embodiments, the pattern in the selectively definable layer 130 can be transferred to one or more underlying layers before depositing the layer 140 of spacer material.

In the illustrated embodiment, with continued reference to FIGS. 16A and 16B, the layer 140 is conformal and assumes the general contours of the underlying topology, thereby forming indentations 201 between mandrels 131a.

In step 29 of FIG. 13, the layer 140 of spacer material is etched, preferably anisotropically etched. The upper surfaces of the mandrels 131d and the second hard mask layer 122 are exposed, as shown in FIGS. 17A and 17B. Spacers 146 are formed at the sides of mandrels 131d. The spacers 146 define holes 202.

Figure 18B:
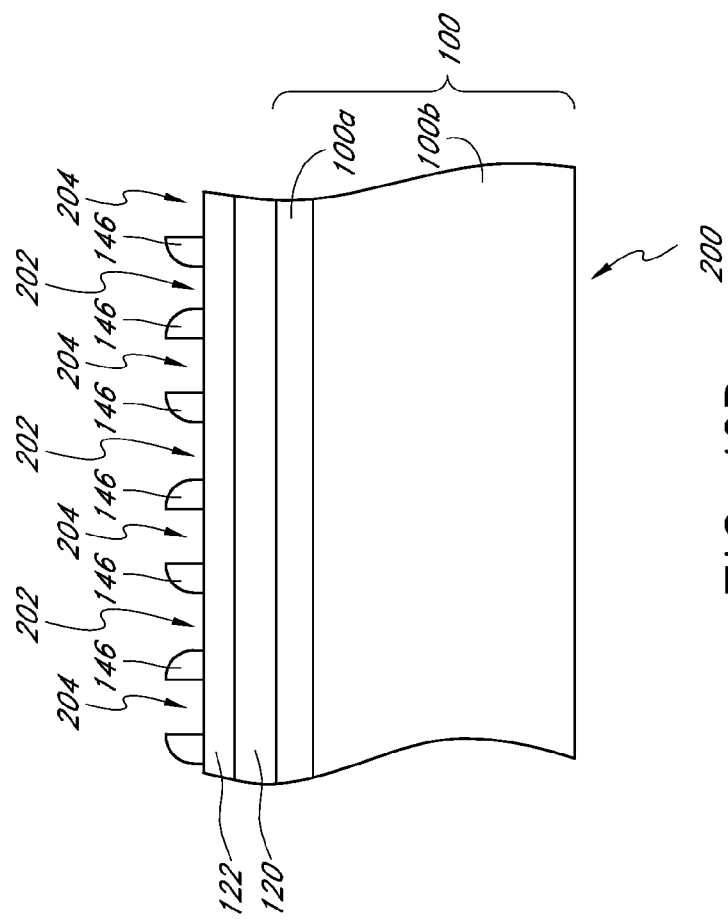
FIG. 18B illustrates a cross-sectional side view of the partially formed integrated circuit of FIG. 18A along the sectional line 18B shown in FIG. 18A in accordance with embodiments of the invention.
Figure 18A:
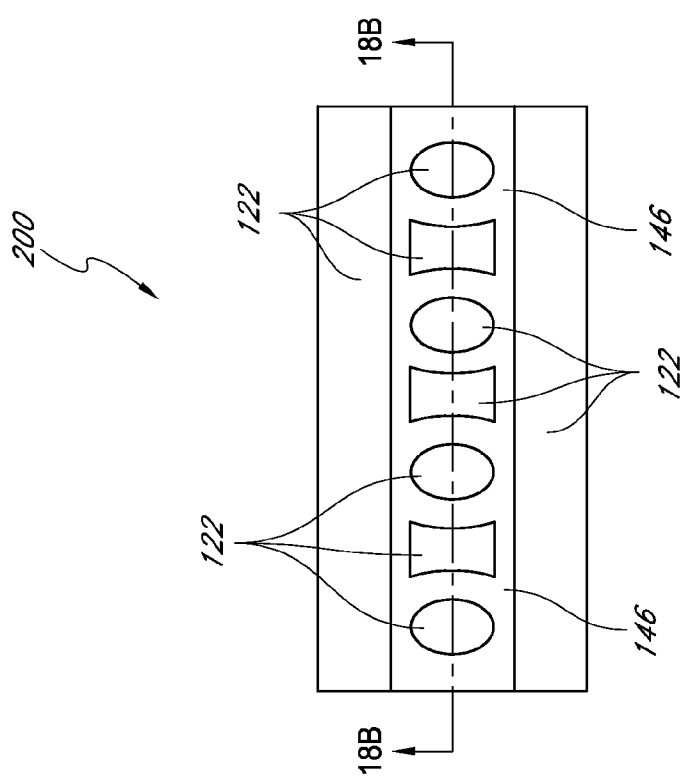
FIG. 18A illustrates a top view of the partially formed integrated circuit of FIG. 17A after etching the pillars to leave a pattern defined by the spacer material in accordance with embodiments of the invention.

In step 31 of FIG. 13, the mandrels 131d are removed by a selective etch. With reference to FIGS. 18A and 18B, the selective etch preferentially removes the selectively definable layer 130 (FIGS. 17A and 17B) relative to the spacers 146. As a result, holes 204 are formed at the locations formerly occupied by the mandrels 131d. It will be appreciated that, taking the linear density of the mandrels 131d as Z, the linear density of the holes is at least 1.5 Z.

In step 33 of FIG. 13, the pattern defined by the spacers 146 is transferred to underlying materials. With reference to FIG. 18B, the pattern is transferred successively to underlying second hard mask layer 122, primary hard mask layer 120 and dielectric layer 100a. The transfer can be accomplished as described above with respect to step 15 of FIG. 1. In some embodiments, a wet organic strip etch may be used to clean the mask before transfer to the substrate 100, as discussed herein.

Figure 19:
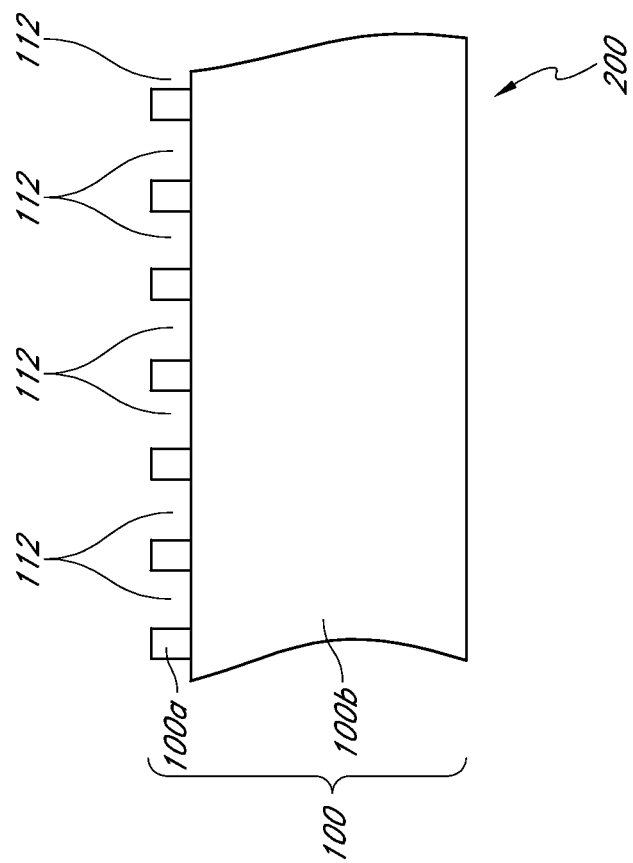
FIG. 19 illustrates a cross-sectional side view of the partially formed integrated circuit of FIG. 18A after transferring the pattern defined by the spacer material to the substrate in accordance with embodiments of the invention.

With reference to FIG. 19, the overlying masking stack is removed. Where the primary masking layer 120 is formed of amorphous carbon, the amorphous carbon can be stripped using, e.g., a wet organic strip etch. Thus, a pattern of openings 112 are formed in the layer 110a. In some embodiments, the openings 112 are contact vias, which may be filled to form conductive contacts to underlying electrical features.

Thus, it will be appreciated that, in accordance with the embodiments described above, a method for semiconductor processing is provided. The method comprises providing a row of laterally separated mandrels formed of a mandrel material. The row extends along a first axis. First and second laterally spaced blocks of mandrel material are provided on a same plane as the mandrels. The first and second blocks extend a length of the row, and the mandrels are disposed between the first and second blocks. A layer of spacer material is blanket deposited over the mandrels. The layer of spacer material is anisotropically etched to form spacers on sides of the mandrels. The mandrels are selectively removed relative to the spacer material and the remaining spacer material forms a mask pattern. The mask pattern to the substrate to forms a row of contact vias in the substrate.

In other embodiments, a method for integrated circuit fabrication is provided. The method comprises providing a row of pillars on a level above a substrate. The pillars have a linear density Z. The row of pillars is replaced with a mask having a row of holes. The mask and holes are disposed on the same level as the pillars. The holes have a width of about 60 nm or less. At least some of the holes are disposed at a location formerly occupied by a pillar. The holes having a linear density at least about 1.5 times Z.

In other embodiments, a partially fabricated integrated circuit is provided. The partially fabricated integrated circuit comprises a plurality of pillars extending on a first axis. First and second laterally spaced blocks formed of the same material as the pillars are provided extending at least between a first and a last of the pillars on the first axis. The pillars are disposed between the first and second blocks. Spacers are disposed on sides of the pillars and on sides of the first and the second blocks.

It will be appreciated by those skilled in the art that various omissions, additions, and modifications may be made to the methods and structures described above without departing from the scope of the invention. All such changes are intended to fall within the scope of the invention, as defined by the appended claims.

We claim:

1. A method for semiconductor processing, comprising:
   providing a substrate;
   providing a layer of selectively definable material over the substrate;
   patterning the layer of selectively definable material to form a row of pillars and a block each formed of the selectively definable material, the block extending along a side of and contacting each of the pillars of the row of pillars, as seen in a top down view, the pillars having a linear density Z; and
   replacing the row of pillars with a row of holes formed in a masking layer disposed on the level formerly occupied by the pillars, at least some of the holes disposed at locations formerly occupied by at least some of the pillars, the holes having a linear density greater than Z.

2. The method of claim 1, wherein the block is disposed on one side of the row, and wherein patterning the selectively definable layer forms another block of selectively definable material on an opposite side of the row.

3. The method of claim 1, wherein the pillars are symmetrical, as seen in a top down view.

4. The method of claim 1, wherein the holes are symmetrical, as seen in a top down view.

5. The method of claim 1, further comprising trimming the pillars and the block to separate the pillars and the block before replacing the row of pillars with the row of holes.

6. The method of claim 5, further comprising selectively removing the block after replacing the row of pillars.

7. The method of claim 1, wherein replacing the row of pillars with the row of holes comprises:
   blanket depositing spacer material on the pillars;
   anisotropically etching the spacer material to form spacers on sides of the pillars; and
   selectively removing the pillars.

8. The method of claim 1, wherein the linear density of the holes is about 1.5 times Z or more.

9. A method for semiconductor processing, comprising:
   providing a row of pillars and a block of selectively definable material extending along a side of the row of pillars, wherein the block and the pillars are in contact and extend on a same level over a substrate, as seen in a top down view, the pillars having a linear density Z;
   replacing the row of pillars with a mask having a row of holes, the mask and holes disposed on the level, the holes having a width of about 60 nm or less, at least some of the holes disposed at a location formerly occupied by a pillar, wherein the holes have a linear density at least about 1.5 times Z; and
   transferring a pattern defined by the holes to the substrate.

10. The method of claim 9, wherein providing the row of pillars and the block comprises simultaneously forming the pillars and the block.

11. The method of claim 10, wherein simultaneously forming the pillars and the block comprises patterning a selectively definable layer.

12. The method of claim 11, wherein patterning the selectively definable layer comprises patterning a photoresist layer to define the pillars and the block in the photoresist layer.

13. The method of claim 9, wherein the linear density of the holes is about 2 times Z.

14. The method of claim 9, wherein the holes have a width of about 30 nm or less.

15. The method of claim 9, further comprising separating the block and the pillars by subjecting the block and the pillars to an etch.

16. The method of claim 9, further comprising removing the block before transferring the pattern defined by the holes to the substrate.

17. The method of claim 9, further comprising transferring a mask pattern formed by the mask having the row of holes to the substrate to form a row of contact vias in the substrate.

18. A method for semiconductor processing, comprising:
providing a row of pillars and a block of masking material extending continuously along a length of the row of pillars, as seen in a top down view, the pillars having a linear density Z, the block spanning between a plurality of the pillars;
replacing the row of pillars with a mask having a row of holes, the mask and holes disposed on the level, the holes having a width of about 60 nm or less, at least some of the holes disposed at a location formerly occupied by a pillar, wherein the holes have a linear density at least about 1.5 times Z; and
transferring a pattern defined by the holes to the substrate.

19. The method of claim 18, wherein the pillars and the block are formed of the same material.

20. The method of claim 18, wherein providing the row of pillars and the block of masking material comprises simultaneously forming the row of pillars and the block of masking material.

* * * * *